United States Patent
Baba

(10) Patent No.: US 7,463,171 B2
(45) Date of Patent: Dec. 9, 2008

(54) PARALLEL CONVERSION CIRCUIT

(75) Inventor: Mitsuo Baba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/691,221

(22) Filed: Mar. 26, 2007

(65) Prior Publication Data

US 2007/0229342 A1    Oct. 4, 2007

(30) Foreign Application Priority Data

Mar. 30, 2006    (JP) .............................. 2006-094675

(51) Int. Cl.
*H03M 9/00*    (2006.01)
(52) U.S. Cl. ...................... 341/100; 341/101
(58) Field of Classification Search .................. 341/50, 341/100, 101; 375/354
See application file for complete search history.

(56) References Cited

U.S. PATENT DOCUMENTS

| | | | | |
|---|---|---|---|---|
| 5,598,156 A | * | 1/1997 | Hush et al. | 341/100 |
| 6,911,923 B1 | * | 6/2005 | Wang et al. | 341/100 |
| 6,985,096 B1 | * | 1/2006 | Sasaki et al. | 341/100 |
| 7,049,983 B2 | * | 5/2006 | Azami et al. | 341/100 |
| 2005/0220089 A1 | | 10/2005 | Kawashima | |

FOREIGN PATENT DOCUMENTS

JP    2005-295117 A    10/2005

* cited by examiner

*Primary Examiner*—Brian Young
(74) *Attorney, Agent, or Firm*—Sughrue Mion, PLLC

(57) ABSTRACT

Disclosed is a serial-to-parallel conversion circuit that detects phase difference between a timing of receiving serial receive data and reconstituting parallel data for each symbol and a timing of outputting the reconstituted parallel data to an inside of an LSI, and outputs the detected phase difference as delay time information.

8 Claims, 6 Drawing Sheets

PARALLEL CONVERSION CIRCUIT

FIELD OF THE INVENTION

The present invention relates to a receiving device in data transmission. More specifically, the invention relates to a parallel conversion circuit that converts serial receive data to parallel data signal and outputs the parallel data signal.

BACKGROUND OF THE INVENTION

In a receiver circuit arranged in an LSI that performs high-speed serial transfer, a serial-to-parallel conversion circuit (termed as parallel conversion circuit) that converts received serial data (termed as serial receive data) to parallel data and outputs the parallel data is provided. Assume that serial receive data, in which each symbol is formed for each consecutive N bits wherein N is a natural number equal to or more than two, is received by a conventional parallel conversion circuit, for example. In this circuit, an uncertain delay time associated with the N bits is present in a delay time resulting from parallel conversion processing (termed as a parallel conversion processing delay time) from when the serial receive data is received until when parallel data reconstituted for each symbol is output.

This phenomenon occurs in the parallel conversion circuit because, according to a timing of receiving the serial receive data, varies a phase difference between a timing of receiving the serial received data and then reconstituting the parallel data for each symbol and a timing of outputting the reconstituted parallel data to an inside of the LSI.

For this reason, this uncertain delay time is accepted as a design specification in a system including the parallel conversion circuit as described above, connected by high-speed serial interface.

In recent years, as seen in an IEEE1588-compliant application for performing high-precision time management or a PON (Passive Optical Network) system application for performing transmission time allocation with high efficiency, a demand for real-time characteristics of a network itself has increased. In systems that use an application which greatly demands the real-time characteristics as described above, a delay time involved in communication between the systems is measured, and the transmission time allocation or the like is performed, based on a result of the measurement.

JP Patent Kokai Publication No. JP-P-2005-295117A (Patent Document 1) discloses a technique capable of suppressing variations in the parallel conversion processing delay time. This technique is used when serial receive data with each symbol formed of 10 bits therein is received and converted to parallel data in synchronization with a comma code (synchronization pattern information). According to this technique, when a bit slip in a comma code (synchronization pattern information) occurs, adjustment is made on a period of a recovery clock, and variations in the parallel conversion processing delay time can be thereby suppressed.

[Patent Document 1]
JP Patent Kokai Publication No. JP-P-2005-295117A

SUMMARY OF THE DISCLOSURE

In the conventional parallel conversion circuit, the serial data is just converted to the parallel data and output. The phase difference between the timing of receiving the serial receive data and then reconstituting the parallel data for each symbol and the timing of outputting the reconstituted parallel data to the inside of the LSI, which varies according to the timing of receiving the serial receive data, is not output as delay time information. For this reason, when a delay time involved in communication between systems is measured in the systems that utilizes the application such as the IEEE1588-compliant application or the PON (Passive Optical Network) system application, which greatly demands the real-time characteristics, accuracy of measurement higher than accuracy of the measurement of the uncertain delay time described above cannot be obtained.

A parallel conversion circuit of the present invention is the parallel conversion circuit that samples serial data, in response to a first clock signal synchronized with the serial data. In the serial data, each symbol is formed for each consecutive N bits (N being a natural number equal to or more than two). The parallel conversion circuit converts the symbol to parallel signals based on a synchronization pattern timing signal and retimes the parallel signals in response to a second clock signal, for output as parallel data. The synchronization pattern timing signal is synchronized with a timing of input of a first bit of the symbol constituting the serial data. This parallel conversion circuit obtains a phase difference between the synchronization pattern timing signal and the second clock signal and outputs delay time information indicating corresponding to the phase difference.

The parallel conversion circuit of the present invention further includes a phase comparison unit comprising:

a counter that is initialized by the synchronization pattern timing signal and repetitively performs counting from one to N, respectively, for each receipt of a pulse of the first clock signal; and a flip-flop that retimes an output of the count in response to the second clock signal and outputs the retimed output as the delay time information.

The meritorious effects of the present invention are summarized as follows.

The parallel conversion circuit of the present invention can output, together with the parallel data, a phase difference between a timing of receiving the serial receive data and then reconstituting the parallel data for each symbol and a timing of outputting the reconstituted parallel data to an inside of an LSI, as delay time information.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE INVENTION

DESCRIPTION OF THE INVENTION

Figure 1:
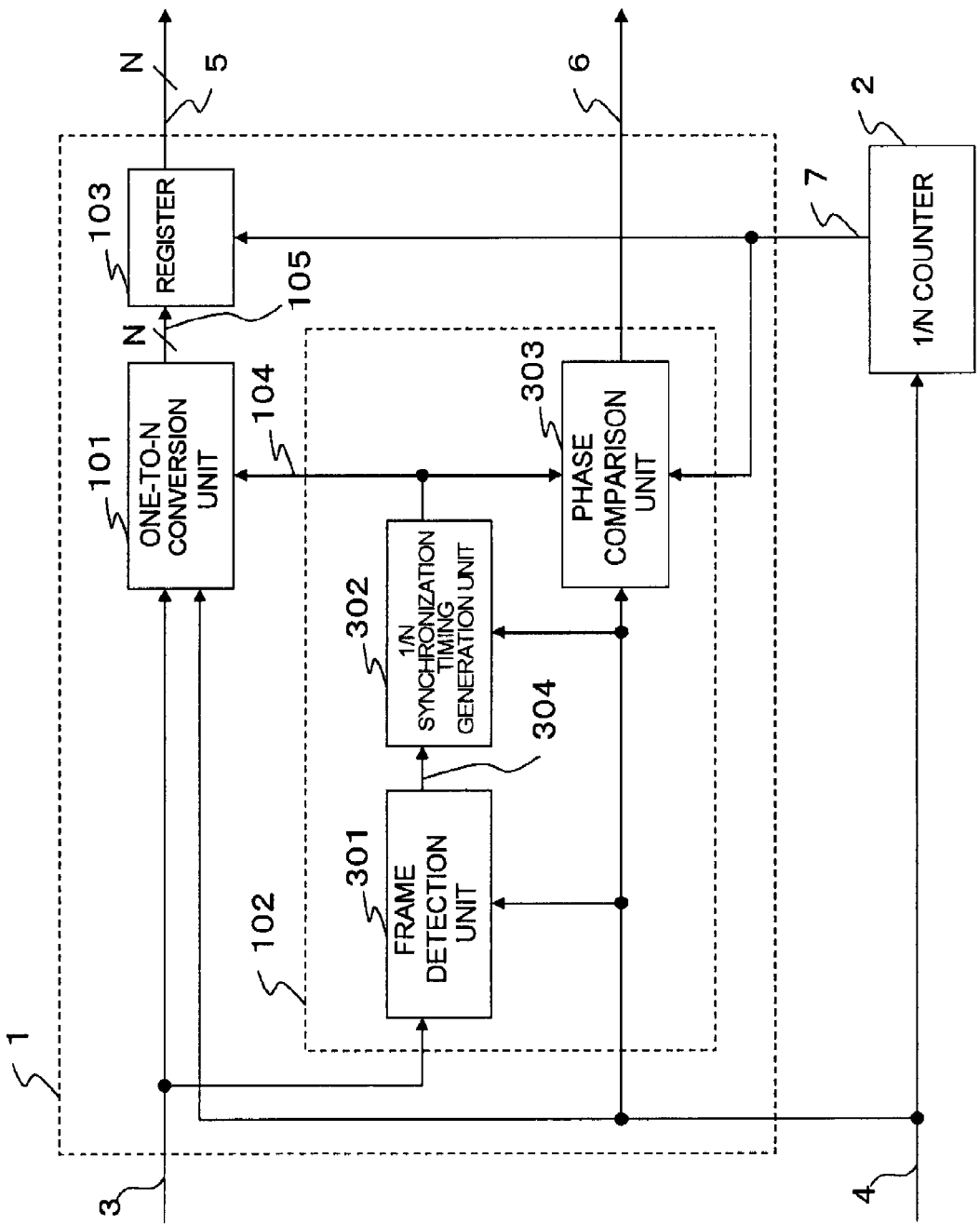
FIG. 1 is a diagram showing the configuration of a parallel conversion circuit of the present invention.

An exemplary example of the present invention will be described in detail with reference to drawings. FIG. 1 shows a parallel conversion circuit of the present invention.

The parallel conversion circuit of the present invention is formed of a 1/N counter 2 and an N parallel conversion section 1.

The 1/N counter 2 is a frequency-division circuit that receives a serial clock signal 4 (a first clock), and outputs a 1/N clock signal 7 (a second clock) obtained by frequency division of the serial clock signal 4 to 1/N (where N is a natural number equal to two or more).

The N parallel conversion section 1 receives serial receive data 3, the serial clock signal 4, and the 1/N clock signal 7 prepared by the 1/N counter 2, and outputs N-bit parallel data signals 5 with first bits thereof aligned according to synchronization pattern information of the serial receive data 3, and delay time information 6, which indicates a logic delay time resulting from parallel conversion processing.

The serial clock signal 4 is a clock which is synchronized with the serial receive data 3 and uses a one-bit data interval of the serial receive data as a period of the clock signal 4. Such a clock is prepared from a received signal by a receiving side, using a CDR (clock and data recovery circuit) or the like, for example.

The N parallel converting section 1 comprises a one-to-N conversion unit 101, a data synchronization unit 102, and a register 103. The serial receive data 3 and the serial clock signal 4 received by the N parallel converting section 1 are both sent to each of the one-to-N conversion unit 101 and the data synchronization unit 102. The 1/N clock signal 7 received by the N parallel converting section 1 is sent to the data synchronization unit 102 and the register 103.

As will be described later, the one-to-N conversion unit 101 receives the serial receive data 3, serial clock signal 4, and a synchronization pattern timing signal 104, and outputs a synchronized parallel signal 105 obtained by parallel converting the serial receive data 3 to N bits according to the synchronization pattern timing signal 104.

The register 103 receives the synchronized parallel signal 105 of the N bits and outputs the N-bit parallel data signal 5 retimed responsive to the 1/N clock signal 7.

The data synchronization unit 102 receives the serial receive data 3, serial clock signal 4, and 1/N clock signal 7, detects synchronization pattern information which has been inserted into the serial receive data 3, and outputs the synchronization pattern timing signal 104 which indicates a detection position of this synchronization pattern information. The data synchronization unit 102 also detects a delay difference between this synchronization pattern timing signal 104 and the 1/N clock signal 7, and outputs the delay difference as delay time information 6. The data synchronization unit 102 comprises a frame detection unit 301, a 1/N synchronization timing generation unit 302, and a phase comparison unit 303.

As will be described later, the frame detection unit 301 receives the serial receive data 3 received by the data synchronization unit 102 in synchronization with the serial clock signal 4, and outputs a synchronization detection signal 304 to the 1/N synchronization timing generation unit 302 when the synchronization pattern information is detected from the received serial receive data.

The 1/N synchronization timing generation unit 302 receives the serial clock signal 4 and the synchronization detection signal 304 from the frame detection unit 301, generates the synchronization pattern timing signal 104 obtained by performing N frequency division of the serial clock signal 4 in synchronization with the synchronization detection signal 304, and outputs the generated synchronization pattern timing signal 104 to the phase comparison unit 303 and the one-to-N conversion unit 101. That is, the synchronization pattern timing signal is the signal synchronized with a timing at which a first bit of a symbol constituting serial data is input. Incidentally, the 1/N synchronization timing generation unit 302 is constituted as a 1/N counter that is reset by the synchronization detection signal 304.

As will be described later, the phase comparison unit 303 receives the serial clock signal 4, 1/N clock signal 7 generated by the 1/N counter, and synchronization pattern timing signal 104 generated by the 1/N synchronization timing generation unit 302, and outputs the delay difference between the 1/N clock signal 7 and the synchronization pattern timing signal 104 as the delay time information 6 detected by the serial clock signal 4.

Figure 2:
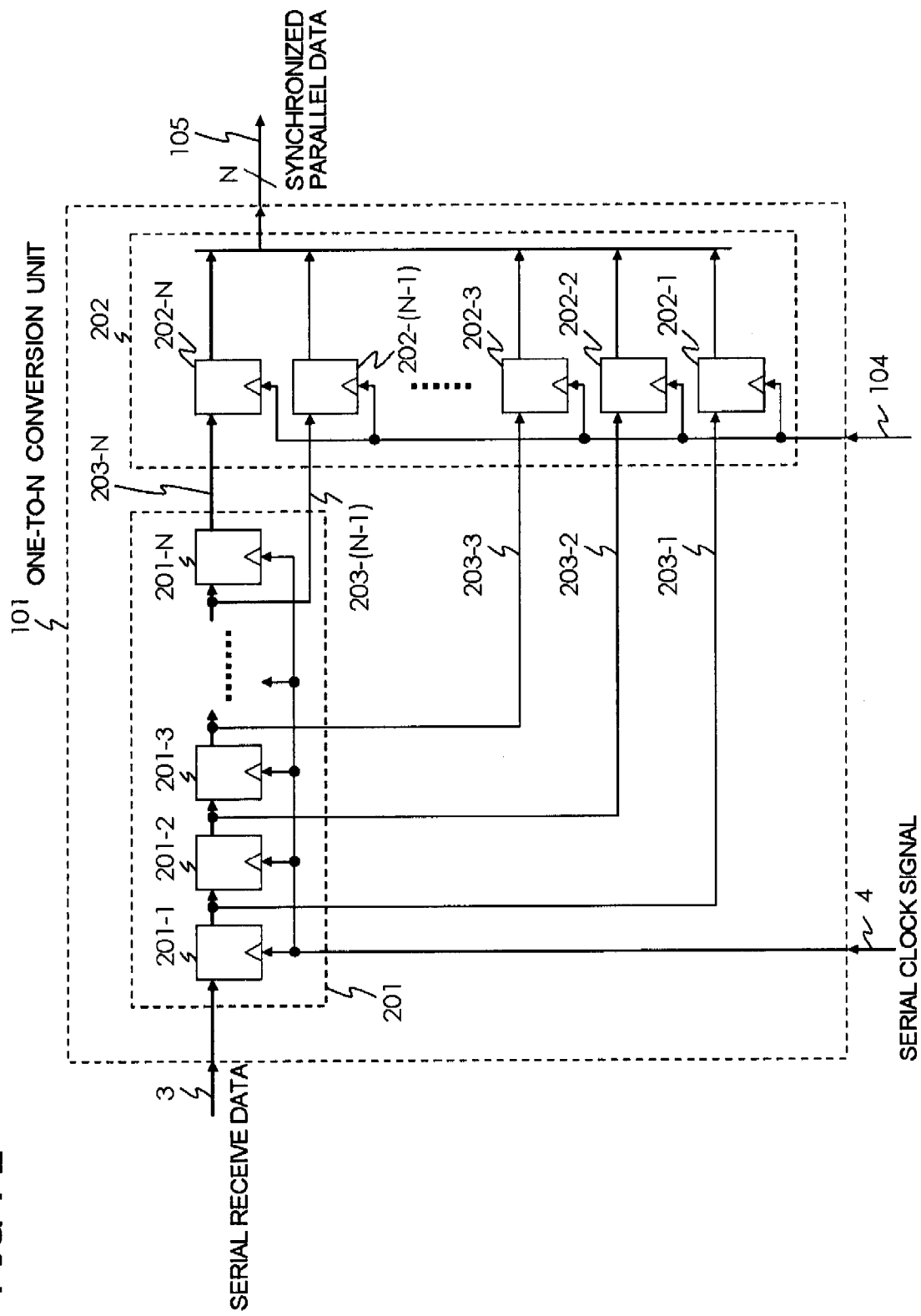
FIG. 2 is a diagram showing an example of the configuration of a one-to-N conversion unit that constitutes the parallel conversion circuit of the present invention.

FIG. 2 is a diagram showing an example of the configuration of the one-to-N conversion unit 101. Referring to FIG. 2, the one-to-N conversion unit 101 comprises an N-bit shift register 201 and a synchronization register circuit 202.

The N-bit shift register 201 comprises N registers 201-1, 201-2, . . . , and 201-N that operate according to the serial clock signal 4. The serial receive data 3 is supplied to the register 201-1, and an output of the resister 201-1 is supplied to the resister 201-2. An output of the register 201-2 is supplied to the register 201-3. The same operation is continued as described above, and the N registers therefore constitute a shift register that performs a shift operation in synchronization with the serial clock signal 4. The N registers 201-1, 201-2, . . . , and 201-N output shift signals 203-1, 203-2, . . . , and 203-N, respectively. Accordingly, the N-bit shift register 201 receives the serial receive data 3, and outputs the shift signals 203-1, 203-2, . . . , and 203-N of N bits, in synchronization with the serial clock signal 4.

The synchronization register circuit 202 comprises N registers 202-1, 202-2, . . . , and 202-N that operate according to the synchronization pattern timing signal 104. As will be described later, the synchronization pattern timing signal 104 is the signal obtained by initializing the serial clock signal 4 and performing the N frequency division of the serial clock signal 4 according to a timing of the synchronization pattern in the serial receive data 3. The synchronization register circuit 202 retimes the shift signals 203-1, 203-2, . . . , and 203-N of the N bits, output by the N bit shift register 201 in response to the synchronization pattern timing signal 104, and outputs resulting signals as N-bit synchronized parallel signals 105-1, 105-2, . . . and 105-N.

Figure 3:
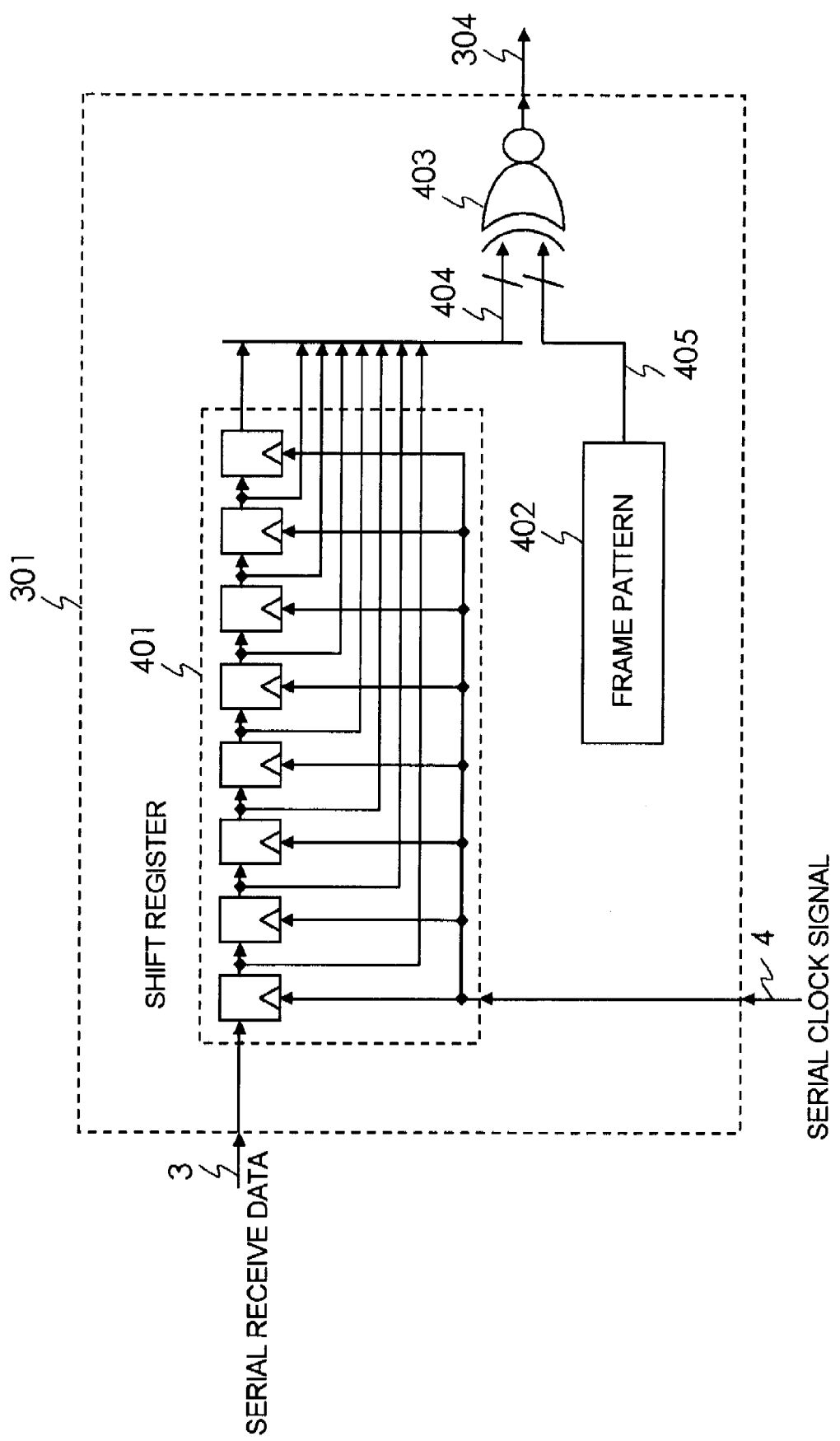
FIG. 3 is a diagram showing an example of the configuration of a frame detection unit that constitutes the parallel conversion circuit of the present invention.

FIG. 3 is a diagram showing an example of the configuration of the frame detection unit 301. From a timing at which a frame pattern is detected, a timing position of the first bit of the symbol in the received serial receive data can be recognized. Referring to FIG. 3, the frame detection unit 301 comprises a shift register 401, a frame pattern unit 402, and an EX-NOR logic circuit 403. In FIG. 3, there is shown the example wherein a synchronization pattern inserted into the serial receive data is formed of consecutive eight bits. The shift register 401 of the frame detection unit 301 in this case comprises eight registers. The frame pattern unit 402 holds synchronization pattern information 405 of the eight bits, and outputs data of the synchronization pattern information 405.

The serial receive data 3 is supplied to a first one of the registers forming the shift register 401, and in synchronization with the serial clock signal 4, the serial receive data 3 supplied one by one is shifted and stored in the eight registers forming the shift register. The EX-NOR (Exclusive NOR) logic circuit 403 outputs as the synchronization detection signal 304 a logic "1" when 8-bit shift data 404, which is constituted from outputs of the series-connected eight registers forming the shift register 401, all match the synchronization pattern information 405 of the eight bits output by the frame pattern unit 402, and outputs a logic "0" otherwise.

When the frame detection unit 301 detects in the received serial receive data 3 the synchronization pattern information 405 stored in the frame pattern unit 402, the frame detection unit 301 outputs a logic "1" to the 1/N synchronization timing generation unit 302 as the synchronization detection signal 304.

Figure 4:
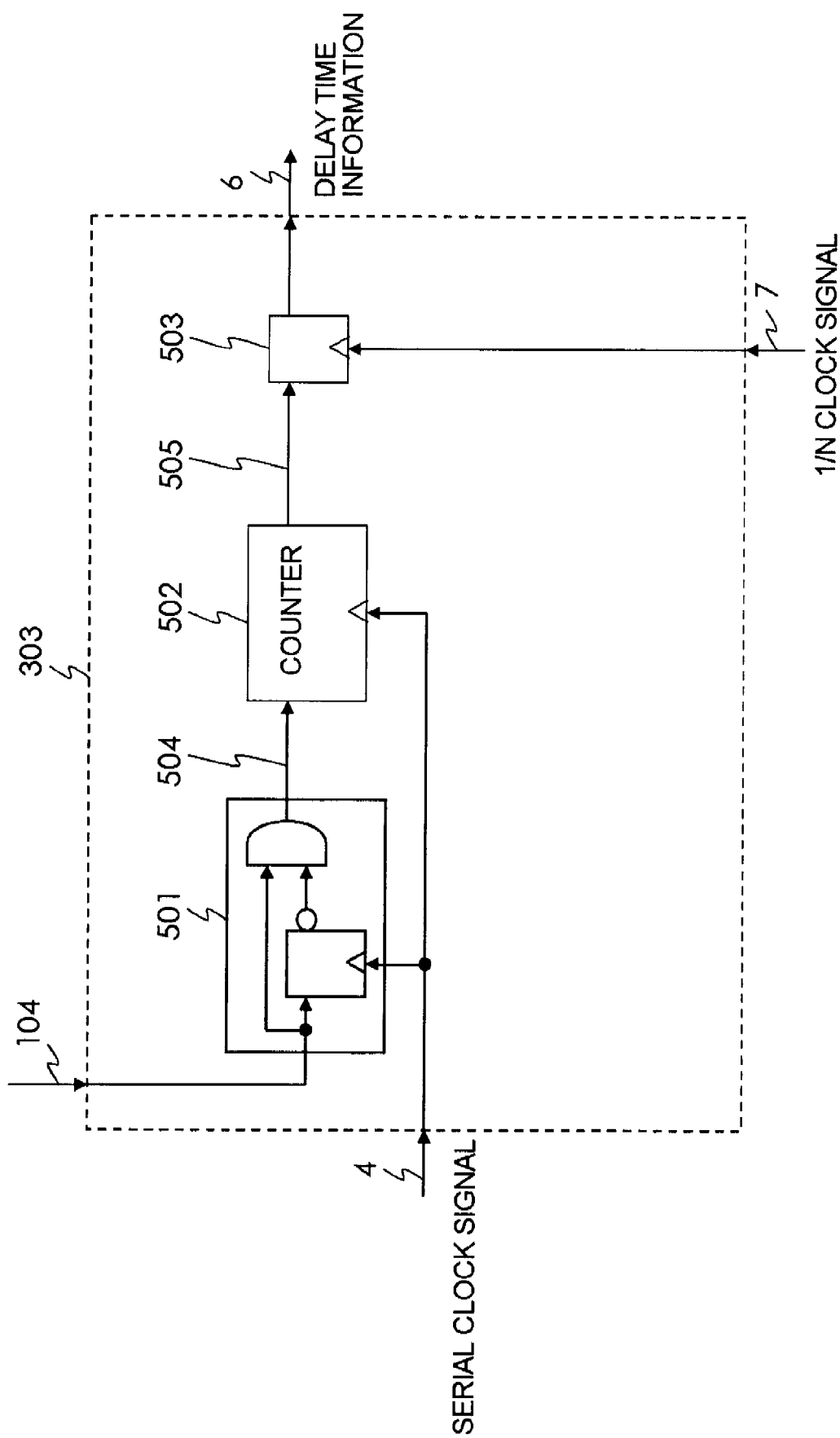
FIG. 4 is a diagram showing an example of the configuration of a phase comparison unit that constitutes the parallel conversion circuit of the present invention.

FIG. 4 is a diagram showing an example of the configuration of the phase comparison unit 303. Referring to FIG. 3, the phase comparison unit 303 comprises a differentiation circuit 501, a synchronization pattern counter unit 502, and a register 503.

The differentiation circuit 501 differentiates a logic "1" level of the synchronization pattern timing signal 104 generated by the 1/N synchronization timing generation unit 302 to generate a pulse of one-bit width, in response to the serial clock signal 4, and outputs the so generated pulse as a synchronization detection position pulse 504. Since only a rising edge of the synchronization pattern timing signal 104 that indicates information on a timing at which the synchronization pattern information is detected is given to a counter in a subsequent stage, a cycle of the output pulse of the synchronization pattern timing signal 104 (synchronization detection position pulse 504) is reduced to one cycle of the serial clock signal 4, using the serial clock signal 4.

Specifically, the differentiation circuit can be formed of a flip-flop and an AND circuit, as shown in FIG. 4. The flip-flop that constitutes the differentiation circuit 505 samples the synchronization pattern timing signal 104 in response to the serial clock signal 4, and outputs an inversion value of sampled data. Then, the synchronization pattern timing signal 104 and this inversion value should be ANDed.

The synchronization pattern counter unit 502 is a counter that is initialized by the synchronization detection position pulse 504 generated by the differentiation circuit 501 and increments a count value whenever the synchronization pattern counter unit 502 receives the serial clock signal 4. The synchronization detection position pulse 504 outputs the pulse for initialization at an interval of the synchronization pattern timing signal 104. Thus, in this example, the synchronization pattern counter unit 502 performs counting from one to N, repetitively. The synchronization pattern counter unit 502 outputs this count value as a synchronization pattern count value 505.

The register 503 retimes this synchronization pattern count value 505 in response to the 1/N clock signal 7 and outputs the retimed synchronization pattern count value as the delay time information 6.

Next, an operation of the present invention will be described using timing charts.

Figure 5:
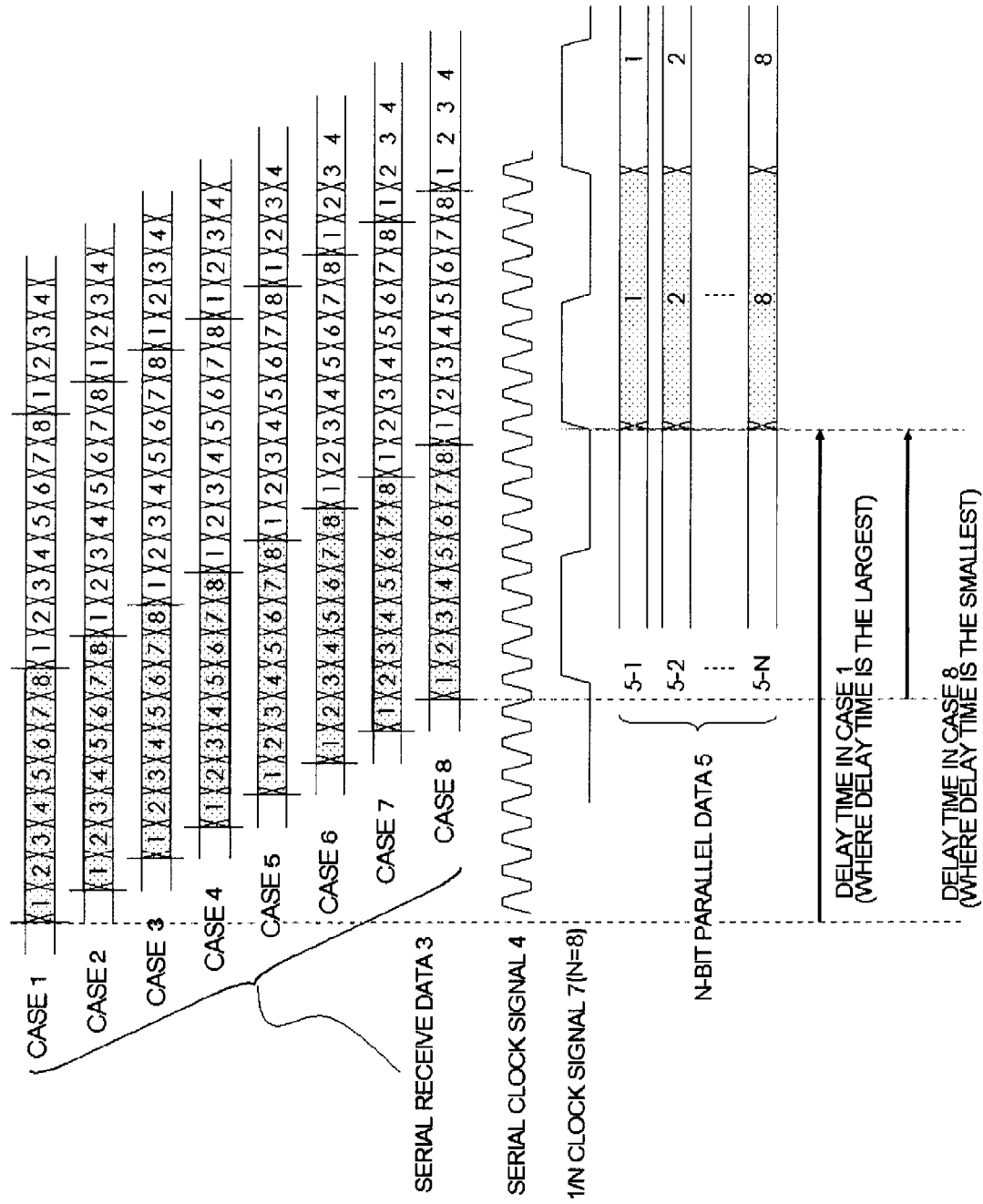
FIG. 5 is a timing chart explaining an operation of the parallel conversion circuit of the present invention.

FIG. 5 shows a case where, in a relationship among the serial receive data 3, serial clock signal 4, 1/N clock signal 7, and N-bit parallel data 5, one symbol is formed of eight bits (when N=8). It is assumed herein that the parallel conversion circuit of the present invention outputs 8-bit parallel data at a timing of a rising edge of the 1/N clock signal 7.

With respect to a processing time from when the serial receive data 3 reaches the parallel conversion circuit to when the serial receive data 3 is converted to the 8-bit parallel data and output, there are eight cases (of cases 1 to 8), depending on timings at which the serial receive data 3 reaches the parallel conversion circuit, as shown in FIG. 5. That is, there are the eight cases from a case in which first-bit data of the serial receive data 3 formed of eight bits reaches at the timing of the rising edge of the 1/N clock signal 7, as in the case 1 in FIG. 5, (this case being referred to as the case where the arrival time is the earliest) to a case where last-bit data of the serial receive data 3 formed of the eight bits reaches, as in the case 8, (this case being referred to as the case where the arrival time is the latest).

These eight cases of the processing time are present for the following reason. Although arrival timings of the serial clock signal 4 and the serial receive data 3 at a receiver circuit are synchronized as described above, the 8-bit parallel data is output in synchronization with the 1/N clock signal 7 obtained by performing the N frequency division of the serial clock signal 4. Thus, a conversion timing deviates according to an arrival timing of the serial receive data 3 at the receiver circuit. That is, a phase difference between a timing of the first bit of each symbol of the serial receive data (a timing of receiving the serial receive data and then reconstituting parallel data for each symbol) and the 1/N clock signal that determines a timing at which the parallel conversion circuit outputs the converted parallel data of N bits (timing of outputting the reconstituted parallel data to an inside of an LSI) differs according to a timing at which the parallel conversion circuit receives the serial receive data. A conversion timing deviation that occurs according to the arrival timing of this serial receive data 3 at the receiver circuit includes a delay time difference corresponding to eight cycles of the serial clock signal 4.

Figure 6:
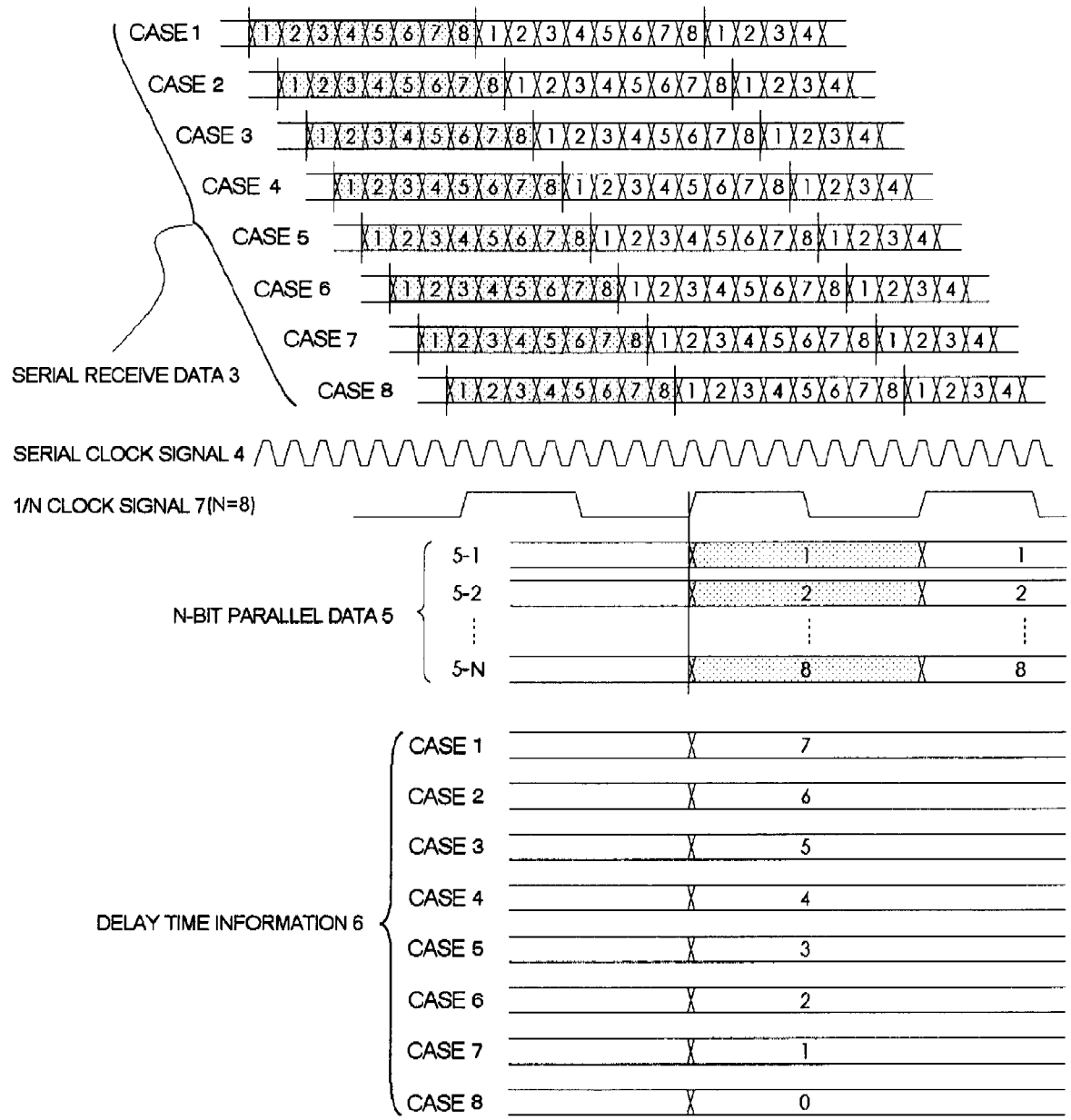
FIG. 6 is a timing chart explaining the operation of the parallel conversion circuit of the present invention.

In a process of conversion from the serial receive data 3 to the 8-bit parallel data 5 in the case 1, data of hatched consecutive eight bits of '1' to '8' in FIGS. 5 and 6 is captured by the N-bit shift register 201 in response to the serial clock signal 4, and then captured by the synchronization register circuit 202 at a timing of the synchronization timing signal 104 as parallel data of eight bits. The parallel data of eight bits sampled by this synchronization register circuit 202 is output to the register 103 as the synchronized parallel data 105, and is output as the 8-bit parallel data 5 synchronized with the 1/N clock signal (hatched 8-bit parallel data 5 in FIGS. 5 and 6).

All of the serial receive data 3 in the eight cases having different arrival times, respectively, is output as the N-bit parallel data 5 at the same output time. This delay time difference places a constraint on a PON system or an IEE1588-compliant system as an uncertain delay time.

FIG. 6 shows a timing chart showing a relationship between the serial receive data 3 in the cases 1 to 8 having different arrival times and the N-bit parallel data 5 and the delay time information 6 to be added in each of the eight cases.

The case 1 shows the case where the arrival time of the serial receive data 3 is the earliest and the processing time until the N-bit parallel data 5 is output is the longest. In this case, the delay time information 6 is output as "7". Likewise, the case 2 shows the case where the arrival time of the serial receive data 3 is the second earliest, and the processing time until the N-bit parallel data 5 is output is the second longest. In this case, the delay time information 6 is output as "6". As described above, according to the processing time, the delay time information 6 of "5", "4", "3", "2", or "1" is output one by one. Then, in the case 8 where the arrival time of the serial receive data 3 is the latest and the processing time until the N-bit parallel data 5 is output is the shortest, "0" is output as the delay time information 6. This delay time information 6 having these "0" to "7" values is respectively output together with the N-bit parallel data 5 when the parallel conversion processing is performed.

In the invention of this application, a phase difference between the timing of the first bit of each symbol in the serial data and the 1/N clock signal that determines the timing at which the parallel conversion circuit outputs the N-bit parallel data is output as the delay time information 6. High-precision delay time measurement in a system in a subsequent stage is thereby made possible. The improvement of transmission efficiency and the high accuracy of delay time in the PON system or the IEEE1588-compliant system are made possible.

Though the example of the invention of this application shows a case where a second clock is generated by N frequency division of a first clock, the second clock does not always need to be generated from the first clock. Further, in regard to a frequency ratio between the first clock and the second clock, there is no need for adhering to the N frequency division. That is, when the parallel conversion circuit includes the phase comparison unit that detects a phase difference between a timing of receiving the serial receive data and then reconstituting the parallel data for each symbol and a timing of outputting the reconstituted parallel data to the inside of the LSI and outputs the detected phase difference as the delay time information, the uncertain delay time can be eliminated, as described above.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A parallel conversion circuit that samples serial data with each symbol formed for each consecutive N bits therein, where N is a natural number equal to or more than two, responsive to a first clock signal synchronized with the serial data, converts the symbol to parallel signals based on a synchronization pattern timing signal, and retimes the parallel signals responsive to a second clock signal, to output the retimed parallel signals as parallel data,
the synchronization pattern timing signal being synchronized with a timing of input of a first bit of the symbol constituting the serial data,
said parallel conversion circuit comprising a circuit that obtains a phase difference between the synchronization pattern timing signal and the second clock signal and outputs delay time information corresponding to said phase difference.

2. The parallel conversion circuit according to claim 1, comprising:
a 1/N counter that performs N frequency division of the first clock signal having a period equal to a transmission period of one bit of the serial data, thereby outputting the second clock signal; and
an N parallel conversion section that receives the serial data, the first clock signal, and the second clock signal, and outputs the parallel data and the delay time information.

3. The parallel conversion circuit according to claim 2, wherein said N parallel conversion section comprises:
a one-to-N conversion unit that samples the serial data in synchronization with the first clock signal and outputs the parallel signals obtained by parallel conversion of the serial data for said each symbol of the N bits, based on the synchronization pattern timing signal;
a data synchronization unit that generates the synchronization pattern timing signal from the first clock signal and a timing of detection of synchronization pattern information inserted into the serial data, detects the phase difference between the synchronization pattern timing signal and the second clock signal, and outputs the detected phase difference as the delay time information; and
a register that outputs the parallel data obtained by retiming of the parallel signals responsive to the second clock signal.

4. The parallel conversion circuit according to claim 3, wherein said data synchronization unit comprises:
a frame detection unit that receives the serial data and outputs a synchronization detection signal when detecting the synchronization pattern information from the serial data;
a 1/N synchronization timing generation unit that receives synchronization detection signal and the first clock signal and the outputs the synchronization pattern timing signal, the synchronization pattern timing signal being synchronized with the synchronization detection signal and obtained by performing the N frequency division of the first clock signal; and
a phase comparison unit that receives the second clock signal and the synchronization pattern timing signal and outputs the phase difference between the second clock signal and the synchronization pattern timing signal as a number of pulses of the first clock signal.

5. The parallel conversion circuit according to claim 4, wherein said phase comparison unit includes:
a counter that is initialized by the synchronization pattern timing signal and repetitively performs counting from one to N, respectively, for each receipt of a pulse of the first clock signal; and
a flip-flop that retimes an output of the count responsive to the second clock signal and outputs the retimed output as the delay time information.

6. The parallel conversion circuit according to claim 1, comprising a phase comparison unit that includes:
a counter that is initialized by the synchronization pattern timing signal and repetitively performs counting from one to N, respectively, for each receipt of a pulse of the first clock signal; and
a flip-flop that retimes an output of the count responsive to the second clock signal and outputs the retimed output as the delay time information.

7. The parallel conversion circuit according to claim 6, wherein said phase comparison unit further includes a differentiation circuit, said differentiation circuit generating from the synchronization pattern timing signal and the first clock a signal that initializes said counter.

8. The parallel conversion circuit according to claim 6, further comprising:
a frame detection circuit unit that outputs a synchronization detection signal in synchronization with the first clock when detecting synchronization pattern information from the serial data; and
a 1/N synchronization timing generating unit that outputs the synchronization pattern timing signal, the synchronization pattern timing signal being synchronized with the synchronization detection signal and obtained by performing N frequency division of the first clock signal.

* * * * *